United States Patent

Kim et al.

[11] Patent Number: 5,280,168
[45] Date of Patent: * Jan. 18, 1994

[54] TAPERED RADIAL TRANSMISSION LINE FOR AN OPTICALLY ACTIVATED HYBRID PULSER

[75] Inventors: Anderson H. Kim, Toms River; Maurice Weiner, Ocean, both of N.J.; Louis J. Jasper, Jr., Fulton, Md.; Robert J. Youmans, Brick, N.J.

[73] Assignee: The United States of America as represented by the Secretary of the Army, Washington, D.C.

[*] Notice: The portion of the term of this patent subsequent to Oct. 3, 2009 has been disclaimed.

[21] Appl. No.: 797,593

[22] Filed: Nov. 25, 1991

[51] Int. Cl.$^5$ .............................................. H01J 40/14
[52] U.S. Cl. .................................. 250/214.1; 250/551
[58] Field of Search ............... 250/208.2, 208.4, 208.6, 250/214.1, 551; 257/21, 53, 458, 459, 436; 333/34, 127, 128, 242; 342/21

[56] References Cited

U.S. PATENT DOCUMENTS

| | | | |
|---|---|---|---|
| 4,032,865 | 6/1977 | Harp et al. | 333/34 X |
| 4,371,845 | 2/1983 | Pitzalis, Jr. | 333/128 X |
| 5,017,793 | 5/1991 | Halsey et al. | 250/551 |
| 5,028,971 | 7/1991 | Kim et al. | 257/459 |
| 5,146,075 | 9/1992 | Kim et al. | 250/214.1 |
| 5,155,352 | 10/1992 | Kim et al. | 250/551 X |
| 5,177,486 | 1/1993 | Kim et al. | 250/214.1 X |

Primary Examiner—David C. Nelms
Assistant Examiner—John R. Lee
Attorney, Agent, or Firm—Michael Zelenka; William H. Anderson

[57] ABSTRACT

The combination of a photoconductive switch coupled to an energy storage device wherein the switch is comprised of photoconductive semiconductor switch while the energy storage device comprises a tapered radio transmission line. A photoconductive semiconductor gallium arsenide switch is embedded in a circular disc of dielectric material having a thickness dimension which reduces linearly outward from the center, with upper and lower layers of continuous radial metallization configured in a circular pattern located thereon. The upper layer of metallization includes an apertured grid adjacent one surface of the switch, while the outer conductor of a coaxial output signal line is connected to the metallization layer on the opposite side with the inner conductor thereof passing through the dielectric layer to the undersurface of the semiconductor switch.

12 Claims, 2 Drawing Sheets

TAPERED RADIAL TRANSMISSION LINE FOR AN OPTICALLY ACTIVATED HYBRID PULSER

GOVERNMENT INTEREST

The invention described herein may be manufactured, used, and licensed by or for the Government for governmental purposes without the payment to me or us of any royalty thereon or therefor.

CROSS REFERENCE TO RELATED APPLICATION

This application is related to U.S. Ser. No. 07/777,575, now U.S. Pat. No. 5,155,352, entitled "Optically Activated Sub-Nanosecond Hybrid Pulser", which was filed in the name of Anderson H. Kim et al on Nov. 25, 1991, and which is assigned to the assignee of the present invention.

BACKGROUND OF THE INVENTION

1. Field of the Invention

This invention relates generally to electrical pulse signal generators and more particularly to a sub-nanosecond, kilovolt pulse generator for use in impulse radar apparatus, active electromagnetic signal jammers, and relatively high power microwave weapon systems.

2. Description of the Prior Art

Recently there has been much research activity into the generation of nanosecond type pulses utilizing a high power photoconductive solid state semiconductor switch coupled to a storage device. In the above cross referenced related application, there is disclosed a sub-nanosecond pulse generator using a radial transmission line comprised of a photoconductive bulk GaAs switch embedded in a circular dielectric disc of constant thickness with radial type layers of metallization formed on top and bottom surfaces thereof. In one embodiment, the layers of metallization are generally circular in configuration with continuous surface areas. In another embodiment, the continuous surface areas of metallization are replaced by a plurality of outwardly extending stripline segments which converge to a region of common metallization at the middle.

Since the characteristic impedance of such a device is inversely proportional to the width of the dielectric separating the top and bottom layers of metallization, the radial transmission line creates a non-uniform characteristic impedance primarily due to its geometrical configuration. Therefore, at a location outward from the center of the radial transmission line, the impedance is smaller compared to that at a location closer in. When the radial transmission line is charged and the photoconductive switch is optically activated, traveling waves begin to flow from the low impedance region to the high impedance region and in the process,, voltage transformation occurs. The variation of this characteristic impedance between the inner edge and outer edge of the radial transmission line acts like a built in voltage step-up transformer. Accordingly, the degree of impedance variation in the radial line will determine the magnitude of voltage gain at a load connected to the device.

For practical system applications, an optically activated hybrid pulser should produce high peak power pulses with subnanosecond risetime. In addition, the pulser should operate reliably for a long period of time.

SUMMARY

Accordingly, it is the principal object of the present invention to provide an improvement in the generation of relatively narrow pulsewidth high power pulses.

It is a further object of the present invention to provide an improvement in optically activated nanosecond kilovolt pulse generator.

And it is yet another object of the invention to provide a more efficient optically activated hybrid type pulse generator for the generation of sub-nanosecond pulses having amplitudes in the order of kilovolts.

The foregoing and other objects of the invention are realized by an optically activated hybrid pulser which includes a radial transmission line of non-uniform thickness. This is achieved by tapering the width of the dielectric medium separating upper and lower metallization layers and formed of continuous circular surface areas. With such a structure, a relatively larger degree of impedance variation results. Using the tapered down radial transmission line as the energy storage element, an enhancement in output voltage gain is achieved.

BRIEF DESCRIPTION OF THE DRAWINGS

The following detailed description of the invention will be more readily understood when considered together with the accompanying drawings in which.

DETAILED DESCRIPTION OF THE INVENTION

Figure 1A:
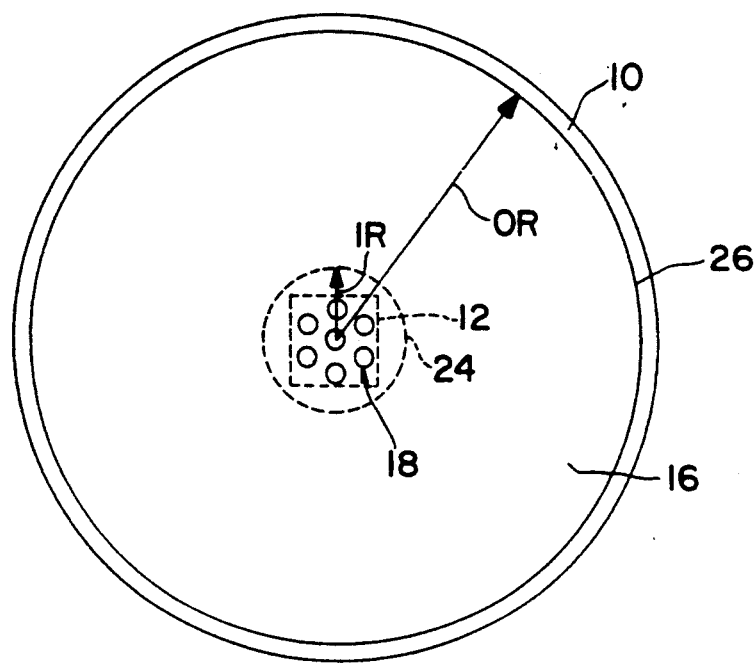
FIGS. 1A and 1B are top planar and central cross-sectional views, respectively, of a radial type optically activated hybrid pulser in accordance with the known prior art.
Figure 1B:
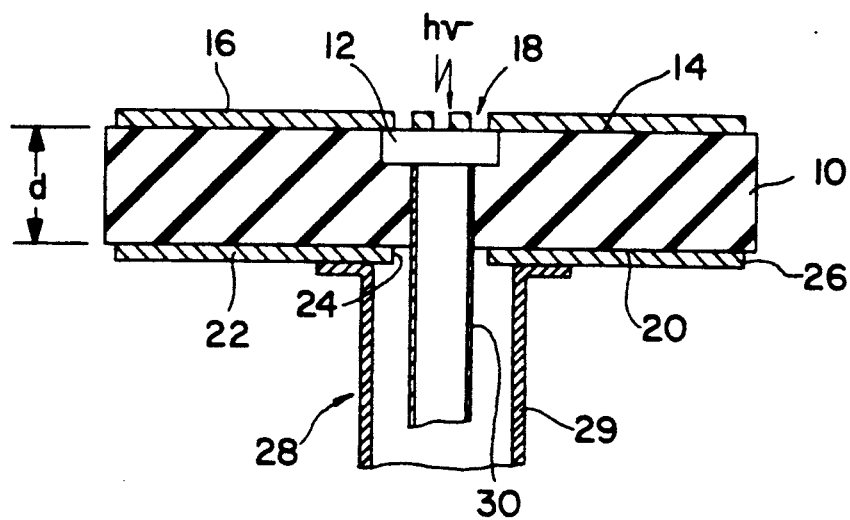

Referring now to FIGS. 1A and 1B, depicted thereat is a prior art device disclosed in the above-referenced related Kim et al application entitled "Optically Activated Sub-Nanosecond Hybrid Pulser", and which is specifically incorporated herein by reference. Shown thereat is a generally flat circular disc 10 of dielectric material of constant thickness and having a photoconductive bulk semiconductor switch 12 centrally embedded in the upper surface 14 as shown in FIG. 1B. The switch 12 comprises a semi-insulating gallium arsenide (GaAs) optically activated switch device. On the upper surface 14 of the dielectric member 10 there is formed a high voltage conducting plate member 16 comprising a layer of metallization which includes an apertured grid 18 (FIG. 1A) including a plurality of through-holes for coupling laser energy from an optical activating source, not shown, to the switch 14. The switch further comprises a bulk GaAs device which can be rendered conductive by laser light from a source, not shown, generating, for example, a 1.06 micron wavelength pulse. The light source typically comprises a neodymium doped yttrium aluminum garnet (Nd:YAG) laser. As shown, the laser light (hν) is introduced in the center portion of the semiconductor switch 12.

On the undersurface 20 of the dielectric disc 10 is formed a second high voltage conducting plate member 22, also comprised of a layer of metallization. The plate of metallization 22 opposes the top layer of metallization 16 and is annular in configuration, being defined by the inner and outer edges 24 and 26 and having an inside diameter IR and an outside diameter OR.

A coaxial output transmission line 28 is connected to the device and is comprised of an outer conductor 29 and an inner conductor 30. The outer conductor 28 is secured to the bottom metallization layer 22, while the inner conductor is shown passing through the underside 20 of the dielectric member 10 to the lower surface 32 of the semiconductor switch 12. When laser light is introduced to the semiconductor switch 12 through the grided aperture 18, photon generated carriers in the bulk semiconductor material reduces the resistivity of the switch so that the inner conductor 30 is electrically connected to the top metallization plate 16. When this occurs, electrical energy stored in the capacitor defined by the dielectric member 10 and the two conducting layers of metallization 16 and 22 is delivered to the inner conductor 30 of the coaxial output line 28 in the form of traveling waves.

For a uniform thickness of the radial transmission line and more particularly the thickness (d) of the dielectric member 10, the degree of characteristic impedance variation is determined by the ratio between the inner diameter 21R and the outer diameter 20R of the transmission line as defined by the dimensions of the lower metallization layer 22.

The characteristic impedances at the inner and outer edges 24 and 26 of the radial transmission line can be expressed as:

$$Z_{OR} = (377d)/2\pi(OR)\sqrt{\epsilon_r} \quad (1)$$

$$Z_{IR} = (377d)/2\pi(IR)\sqrt{\epsilon_r} \quad (2)$$

where $\epsilon_r$ is the dielectric constant of the dielectric material utilized in the member 10. In such a configuration, the voltage output $V_{out}$ from the coaxial cable 28 can be expressed as:

$$V_{OUT} = [(V_o \times Z_o)/(Z_{IR} + Z_o + R_s)][Z_{IR}/Z_{OR}]^{\frac{1}{2}} \quad (3)$$

where $Z_o$ is the load impedance of a load connected to the coaxial line 28, $R_s$ is the equivalent resistance of the semiconductor switch 12, and $V_o$ is the bias voltage applied for charging the capacitance formed by the dielectric member 10 and the metallization layers 16 and 22. The square root term expresses the voltage transformation property as the wave proceeds toward the center of the radial line to the coaxial cable 28.

As expressed in equations (1) and (2), the parameters affecting the characteristic impedance of the radial transmission line are the length of the conductive layer, i.e., the difference between OR and IR and the thickness d. Thus a voltage gain is generated at the load in accordance with equation (3) which can be controlled by varying the ratio between $Z_{IR}$ and $Z_{OR}$.

Figure 2A:
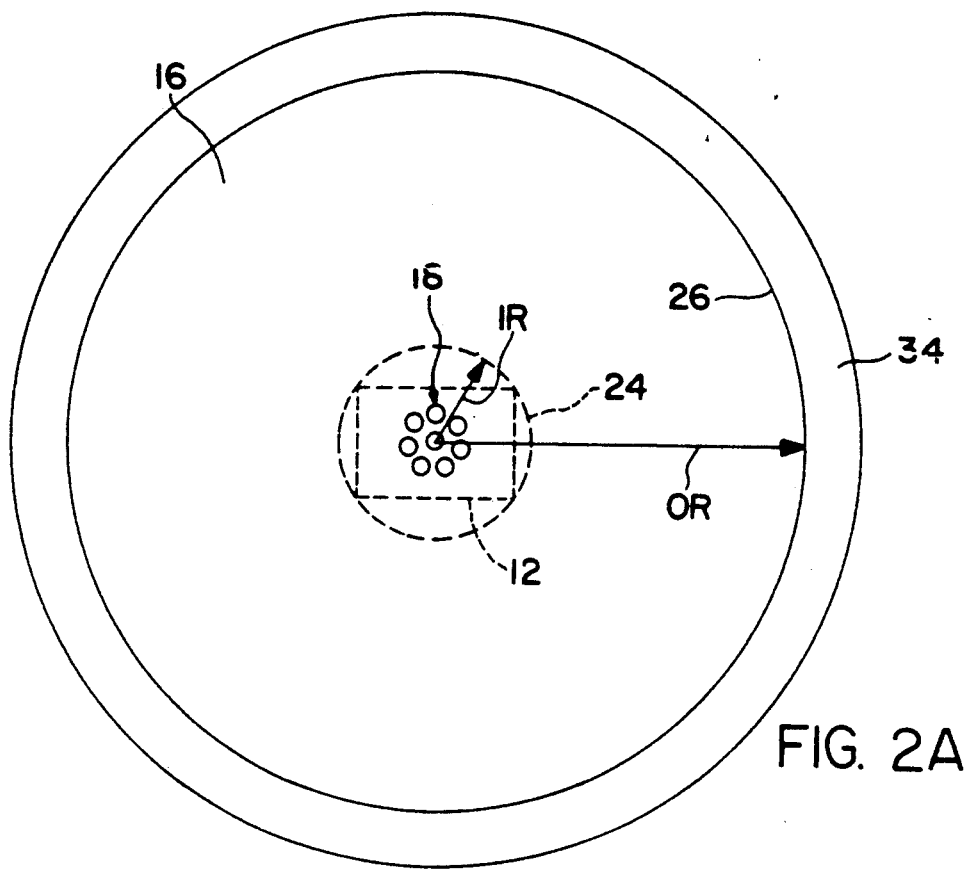
FIGS. 2A and 2B are top planar and central cross sectional views illustrative of the preferred embodiment of the subject invention.
Figure 2B:
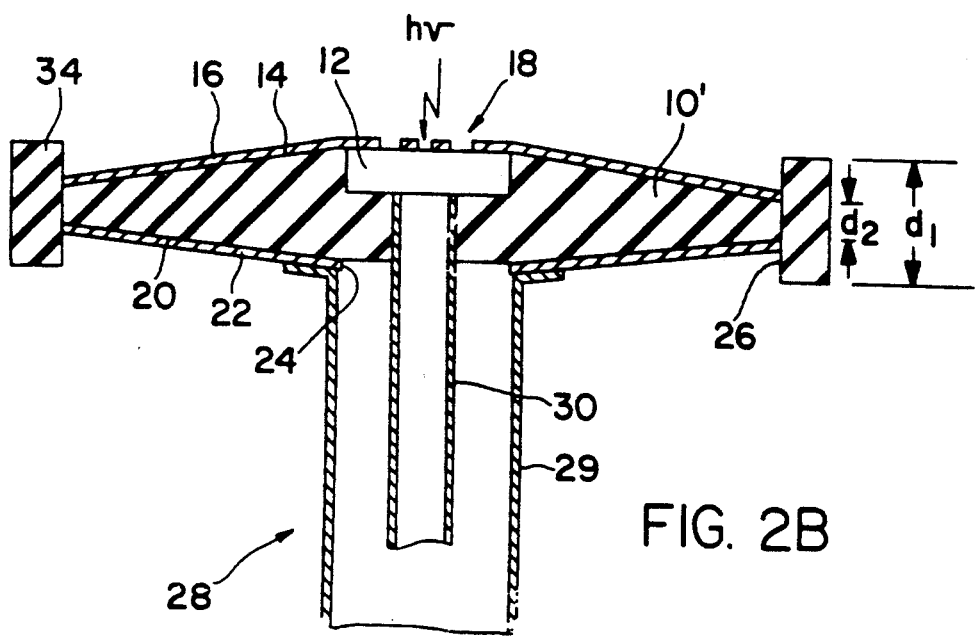

This now leads to a consideration of the preferred embodiment of the subject invention which is illustrated in FIGS. 2A and 2B. Instead of a uniform thickness of the radial transmission line as determined by the dimension d of the dielectric member 10, a non-uniform thickness is now provided by a tapered dielectric member 10' as shown in FIG. 2B, where the thickness reduces from a dimension $d_1$ at the middle, to a thickness dimension $d_2$ at the outer extremity, i.e. at the outer edge 26. Further as shown, the taper is linear along both the upper and lower surfaces 14 and 20. An outer ring 34 of dielectric material having a height equal to the inner thickness dimension $d_1$ of the tapered dielectric member 10' is also located on the perimeter as defined by the outer edge 26.

As noted earlier, a radial transmission line has an inherent step-up voltage transformation property, with the degree of voltage amplitude enhancement being determined by the characteristic impedance difference between $Z_{IR}$ and $Z_{OR}$. By tapering the radial transmission line by way of the dielectric medium 10' as shown in FIG. 2B, a much greater impedance gradient between $Z_{IR}$ and $Z_{OR}$ is provided so that a much higher voltage gain is achieved. By enhancing the voltage transformation property by tapering the transmission line, the required output voltage amplitude can be produced even with moderate bias voltage amplitude so that the durability of the optically activated hybrid pulser can be extended.

Having thus shown and described what is at present considered to be the preferred embodiment of the invention, it should be noted that the same has been made by way of illustration and not limitation. Accordingly, all modifications, alterations and changes coming within the spirit and scope of the invention are herein meant to be included.

What is claimed is:

1. A nanosecond signal generator, comprising:
   an electrical energy storage device coupled to a source of electrical voltage and including a tapered transmission line comprised of a dielectric member sandwiched between upper and lower radial type electrical conductors, said dielectric member being tapered such that its thickness is reduced radially outward from a central region; and
   a photoconductive switch coupled to said energy storage element, wherein said switch comprises a semiconductor switch centrally located beneath said upper conductor and wherein said upper conductor includes aperture means thereat for the application of light energy to said switch, and wherein said switch becomes conductive upon the application of predetermined type of light energy to cause a relatively high amplitude, narrow output pulse of nanosecond pulsewidth dimensions to be generated at the center of said upper and lower radial type conductors.

2. The pulse signal generator according to claim 1 and further comprising coaxial transmission line means coupled to one of said electrical conductors and said photoconductive switch for coupling said output pulse to a load.

3. The pulse signal generator according to claim 2 wherein said coaxial transmission line means includes a first conductor coupled to said photoconductive switch and a second conductor coupled to said lower conductor, said switch becoming conductive by the application of said light energy to couple said first conductor to said upper conductor.

4. The pulse signal generator according to claim 3 wherein said photoconductive semiconductor switch comprises a bulk semiconductor switch device embedded in said dielectric medium.

5. The pulse signal generator according to claim 4 wherein said semiconductor switch device is comprised of GaAs.

6. The pulse signal generator according to claim 4 wherein said upper and lower conductors comprise respective outer layers of metallization.

7. The pulse signal generator according to claim 6 wherein said upper and lower layers of metallization comprise continuous circular patterns of metallization.

8. The pulse signal generator according to claim 8 wherein said upper layer comprises a circular layer of metallization including a set of light apertures at the center and said lower layer comprises an annular circular layer having an inside diameter defining a central opening and an outside diameter defining the periphery of the energy storage device.

9. The pulse signal generator according to claim 8 wherein said dielectric medium comprises a tapered circular disc of dielectric material having a linearly tapered thickness.

10. The pulse signal generator according to claim 8 wherein said first conductor of said coaxial transmission line means comprises an inner conductor passing through said central opening and said dielectric medium to said semiconductor switch device and said second conductor of said coaxial transmission line means comprises an outer conductor coupled to said lower layer of metallization.

11. The pulse signal generator according to claim 1 further comprising a dielectric ring disposed at an outer edge of said transmission line.

12. The pulse signal generator according to claim 1 wherein said dielectric ring is equal in thickness to the thickness of the central region of the transmission line.

* * * * *